_United States Patent_ [19]

Schneider

[11] 4,377,604

[45] Mar. 22, 1983

[54] COPPER STABILIZED DIPPING SOLUTION FOR A PHOTOVOLTAIC DEVICE INCORPORATING A $CU_xS$ LAYER

[75] Inventor: Ronald A. Schneider, Albany, Calif.

[73] Assignee: Chevron Research Company, San Francisco, Calif.

[21] Appl. No.: 274,337

[22] Filed: Jun. 17, 1981

[51] Int. Cl.³ .................... H01L 31/18; H01L 31/02; B05D 1/36
[52] U.S. Cl. ...................................... 427/75; 427/74; 136/260
[58] Field of Search .................... 427/74, 75

[56] References Cited

U.S. PATENT DOCUMENTS 4,086,101  4/1978  Jordan et al. .................. 427/54.1 X
4,143,235  3/1979  Duisman ........................ 357/61 X

OTHER PUBLICATIONS

Jindra et al., "Preparation of High–Purity CuCl", _Chemický Prùmysl_, vol. 15, No. 9, pp. 560–561 (1965).
Kirk–Othmer's Encyclopedia of Chemical Technology, vol. 6, p. 271.

_Primary Examiner_—James R. Hoffman
_Attorney, Agent, or Firm_—D. A. Newell; E. J. Keeling; A. Stephen Zavell

[57] ABSTRACT

A copper stabilized dipping solution for a photovoltaic device incorporating a $Cu_xS$ layer. The dipping solution contains copper metal which stabilizes the solution by providing a source of copper to continuously reduce $CU^{++}$ ions to $Cu^+$ ions. The copper has no adverse effect on the topochemical formation of a copper sulfide layer on, for example, a semiconductor cadmium sulfide layer in a photovoltaic device. Preferably, the copper stabilized dipping solution has a pH less than about 4.5 and includes counter ions such as chloride or bromide ions.

9 Claims, No Drawings

COPPER STABILIZED DIPPING SOLUTION FOR A PHOTOVOLTAIC DEVICE INCORPORATING A CU$_x$S LAYER

BACKGROUND OF THE INVENTION

This invention relates to production of photovoltaic thin films, such as might be used for solar cells. More specifically, this invention relates to stabilized solutions for the formation of a copper sulfide layer in a photovoltaic device.

Solar cells are capable of converting solar radiation into usable electrical energy. One approach to making solar cells widely being researched at the present time is the production of photovoltaically active thin films of copper sulfide on various semiconductor materials such as cadmium sulfide. The copper sulfide layer is usually less than about 1 micrometer thick, and the semiconductor, cadmium sulfide, layer is usually about 20–50 micrometer thick. When the copper sulfide composition is represented by the formula Cu$_x$S, it is generally believed that for the best photovoltaic performance x should be above 1.95, and preferably above 1.99 as disclosed in U.S. application Ser. No. 197,414 filed Oct. 16, 1980 and incorporated herein by reference.

In the cadmium sulfide/copper sulfide solar cells, a preferred method of forming the copper sulfide layer is by dipping a layer of cadmium sulfide, which has been deposited on a conductive substrate, into an aqueous acidic solution of cuprous ion. Cadmium ions dissolve in the solution and are replaced in the sulfide crystal lattice by cuprous ions. This type of ion exchange replacement reaction is termed topochemical. Suitable solutions are taught in the previously mentioned application and in U.S. Pat. Nos. 4,086,101 and 4,143,235, both of said patents incorporated herein by reference.

A major problem with the topochemical fabrication of the copper sulfide layer is the presence of cupric ion, Cu$^{++}$, in the aqueous curpous ion solution. Cupric ions and cuprous ions compete to replace cadmium ions in the sulfide crystal lattice. The more cupric ions in solution and incorporated in Cu$_x$S layer, the lower the value of x in the resulting Cu$_x$S. The cuprous solutions typically used are readily oxidized by air to form cupric ion. Moreover, the cuprous compound used to make the solution usually contains traces of cupric ions unless elaborately purified and used immediately after purification. Even in cases where precautions are taken to exclude air, x is often found to be below 1.99 due to random occasional admission of air.

Thus, it would be desirable to find a means of continuously reducing any cupric ion in the cuprous solution to cuprous ion. In that way, laborious purification of the starting cuprous salt would not be necessary, nor would introduction of air cause irreparable damage to the stoichiometry of the solution. However, soluble redox compounds which might perform that function might also attack or interfere with or be occluded by the growing copper sulfide layer. It would be highly desirable to find an agent for continuous reduction of Cu$^{++}$ to Cu$^+$ that would not be soluble and thus would not interfere with the copper sulfide layer and yet would maintain the cupric ion concentration in the solution at a low level.

SUMMARY OF THE INVENTION

The present invention provides an improved method for the topochemical formation of the copper sulfide layer in a thin-film photovoltaic device, which method consists of contacting the cuprous ion solution with metallic copper so as to create and maintain a low cupric ion concentration. The present invention also provides an improved solar cell fabricated by said method.

DETAILED DESCRIPTION OF THE INVENTION

I have found that metallic copper is capable of reducing cupric ion to cuprous ion in aqueous cuprous ion solutions, yet it has no effect on the topochemical formation of a copper sulfide layer on, for example, cadmium sulfide other than that ascribable to maintaining the cupric ion concentration in solution at a low level.

Preferably, the solution contains a counter ion such as chloride ion, bromide ion and the like, which stabilizes curpous ion by complexing with it. When chloride ions are selected as the counter ion, there should be at least two chloride ions, Cl$^{-1}$, for each cuprous ion, Cu$^+$. Preferably, there should be at least three Cl$^{-1}$ ions for each Cu$^+$ ion.

Preferably, the pH of the solution should be less than about 4.5, more preferably less than about 3, and most preferably less than about 2. A pH of about 1.5 to 2.5 is a particularly preferred pH because it is sufficiently acid to accelerate the rate of attack of metallic copper on cupric ion, but the acid is sufficiently dilute that the acid does not rapidly attack the cadmium sulfide.

One particularly preferred method of forming a suitable solution is to dissolve reagent grade cuprous chloride taken directly from the bottle in an aqueous solution of hydrochloric acid and sodium chloride. The cuprous chloride need not be specially purified, as had invariably been required in the past, because any cupric ion in it will be reduced by the copper. An amount of acid is selected which will give a pH in the range from about 1 to about 2. The sodium chloride is added to increase the chloride concentration to stabilize the cuprous chloride complex.

Preferably, the metallic copper which contacts the solution is of high surface area. High surface area can be achieved by using finely divided copper, copper turnings, copper ribbons, or copper foil. The surface area can be increased even further by chemical etching.

Preferably, the surface of the copper should be clean and free from corrosion. One preferred method of achieving such a clean surface is by chemically etching the copper immediately before use. For example, nitric acid vigorously attacks copper, removing the surface and leaving an active, high area surface except that it is covered by an oxide layer. Hydrochloric acid removes copper oxide. By etching first with 1 M nitric and then 1 M hydrochloric acids, a very active, corrosion-free surface can be obtained.

The effects on the concentration of cupric ion by the addition of active copper metal to the cuprous ion solution can be monitored by observing the electrochemical potential of the solution vs. a standard electrode, for example a silver/silver chloride electrode. In addition, as the Cu$^{++}$ ion is converted to Cu$^+$, the characteristic blue color of the Cu$^{++}$ ion in solution fades. Thus, there are two independent means of observing the effect of the addition of active copper metal to the solution.

Having described the invention the following examples are considered to be illustrative and are not intended to limit the scope of the invention. Modifications which would be obvious to one of ordinary skill in the solar cell art, such as substituting $Zn_xCd_{(1-x)}S$ for CdS, are contemplated to be within the scope of the invention.

EXAMPLE 1

A dip solution capable of forming a $Cu_xS$ layer on a CdS layer was made by dissolving 0.40 grams of cuprous chloride (J. T. Baker Reagent Grade, assay 93.2%, used without purification), 0.80 grams of sodium chloride, and 2 ml of concentrated HCl in 400 ml of water. Based upon a liter, the amounts are 1 gm/l, CuCl, 2 gms/l NaCl, and 5 ml/l conc. HCl. The cuprous ion concentration is about 0.01 mole per liter. The solution was heated to 90° C. The solution had a pH of 1.5 and had a slightly blue color. The electrochemical potential of the solution with respect to a silver-silver chloride electrode was +0.14 volts. Thereafter, 5 grams of copper granules which had been etched in 1 M nitric acid followed an etching in 1 M HCl and subsequent washing in deionized water, were added to the solution. The potential of the dip solution dropped to +0.00 volt and the solution became colorless. The voltage corresponds to a $Cu^{++}$ ion concentration which is $10^{-5}$ M or less.

The copper metal was removed from the dip solution and $Cu^{++}$ ions were added to make the $Cu^{++}$ ion concentration in the solution $10^{-3}$ M. The potential of the solution was +0.11 volts and the solution had a pale blue color. Additional cupric ions were added to raise the concentration to $10^{-2}$ molar, the potential was +0.16 volt and the solution was blue. The copper metal was added again and the potential dropped to 0.00 volt at equilibrium and the solution was colorless. This proves the effectiveness of copper metal in maintaining a low concentration of cupric ions.

EXAMPLE 2

When the potential was measured in a similar way for a cuprous solution similar to Example 1 but prepared from carefully purified cuprous chloride and prepared for the purpose of making high-efficiency solar cells as part of a large-scale experimental program, the potential was found to be +0.05 even though the solution appeared colorless. Such a potential corresponds theoretically to a $Cu^{++}$ ion concentration of $10^{-4}$ M. Adding copper metal to the solution reduced the potential to 0.00 volts; therefore, the $Cu^{++}$ ion concentration was reduced at least an order of magnitude to about $10^{-5}$ M or less.

EXAMPLE 3

A solution similar to Example 1 was made up and a transparent glass substrate having a transparent conductive layer of indium tin oxide (ITO) with a layer of cadmium sulfide ohmically contacting said ITO was dipped into the solution for about 50 seconds. The solution was at about 75° C. The $Cu^{++}$ ion concentration was less than or equal to the concentration in the purified solution of Example 2. Upon analysis, the copper sulfide layer had an x value of about 1.99 without an $H_2$ treatment.

EXAMPLE 4

A layer of cadmium sulfide about 30 micrometers thick was deposited by evaporation on a plate of glass which had been previously coated with a layer of copper followed by a layer of zinc. The plate was broken into equal pieces. A dip solution was prepared by boiling a solution of 4.1 l of deionized water, 20 ml of concentrated hydrochloric acid, and 8.0 g of sodium chloride under an argon blanket for 20 minutes, until the volume was about 4.0 l, then reducing the temperature to 99° C. and adding 4.0 g of cuprous chloride (J. T. Baker Reagent Grade, and without further purification). The electrochemical potential of the solution vs. a standard silver-silver chloride electrode was +0.15 v.

One piece of the plate was etched in 3 M hydrochloric acid at 60° C. for 40 seconds, rinsed in deionized water, dipped in the above dip solution for 20 seconds, rinsed in 0.01 M hydrochloric acid, rinsed in water, dried under nitrogen, heated in a hydrogen atmosphere at 150° C. for 16 hours, gridded with gold lines by evaporation of gold, and tested for photovoltaic activity in the conventional fashion.

Immediately following the above-described dipping, 15 g of freshly cleaned and etched copper turnings was added to the dip solution, which was stirred at 99° C. for 30 minutes. Then a second piece of the plate, believed to be in every way substantially identical to the first, was etched, rinsed, dipped, rinsed, heat-treated, and tested exactly as the first had been except that the dip solution in the second case contained copper.

Results are shown in the following table. After the initial hydrogen heat treatment, and also after a number of subsequent hydrogen heat treatments designed to optimize performance of the samples, the second sample was superior to the first in every important parameter. Moreover, the second sample required a shorter period of hydrogen heat treatments to reach maximum efficiency.

|  |  | Duration of $H_2$ Treatment Hr | Fill Factor | Open Circuit Voltage, v | Short Circuit Current mA | Efficiency % |
| --- | --- | --- | --- | --- | --- | --- |
| Initial result | First Sample | 16 | 0.739 | 0.503 | 6.84 | 3.14 |
|  | Second Sample | 16 | 0.749 | 0.526 | 9.76 | 4.79 |
| Maximum efficiency | First Sample | 129 | 0.710 | 0.513 | 11.80 | 5.33 |
|  | Second Sample | 112 | 0.736 | 0.527 | 12.67 | 6.10 |

EXAMPLE 5

The experiment described in Example 4 was replicated starting with a different cadmium sulfide-coated plate and freshly prepared solutions. Results are as follows:

|  |  | Duration of $H_2$ Treatment Hr | Fill Factor | Open Circuit Voltage, v | Short Circuit Current mA | Efficiency % |
| --- | --- | --- | --- | --- | --- | --- |
| Initial result | First Sample | 16 | 0.758 | 0.484 | 4.42 | 2.01 |
|  | Second Sample | 16 | 0.760 | 0.520 | 8.40 | 4.13 |
| Maximum efficiency | First Sample | 128 | 0.711 | 0.502 | 10.83 | 4.79 |
|  | Second Sample | 112 | 0.746 | 0.523 | 11.04 | 5.35 |

EXAMPLE 6

In a number of identical flasks containing nitrogen bubblers and means for excluding air, a solution of 1.6 g of crude cuprous chloride, 0.5 g of sodium chloride, and 5 ml of 0.5 N hydrochloric acid in 250 ml of water was heated to reflux. The control solution had a faint but distinct blue color, due to the presence of cupric ions. The pH was about 2.3.

To one flask was added 1 g of hydroxylamine hydrochloride, and to another, 1 g of hydrazine dihydrochloride. No change in the color appeared in either case. To a third flask was added 0.08 g of hydrazine. The solution turned brown and the pH became about 6.5.

To a fourth flask was added 25 g of copper granules which had been etched with 1 M nitric acid then washed with water. The solution turned colorless and remained so, while the pH was essentially unchanged.

EXAMPLE 7

A solution of 4.0 g of sodium chloride and 1.0 g of 2-bromopropionic acid in 400 ml of water was heated to 90° C. in a three-necked flask containing a nitrogen bubbler, reflux condenser, and mechanical stirrer. Sodium hydroxide solution was added until the pH was 3.0. Then 0.4 g of cuprous chloride was added without special purification. The solid dissolved to give a pale blue solution. Then 25 g of copper granules were etched for 30 seconds with 1 M nitric acid, rinsed well with water, and added. Within 5 minutes the solution became colorless. The final pH was 2.9.

More sodium hydroxide was added until the pH was 3.5. Enough cupric chloride solution was added to more or less restore the original blue color. Stirring and heating were continued, and again in less than 5 minutes the blue color disappeared. The pH was measured again and found to be 3.9.

More sodium hydroxide was added to bring the pH to 4.0. Again cupric chloride was added, and again the blue color disappeared within 5 minutes. Final pH was 4.2.

More sodium hydroxide was added to bring the pH to 4.5. The solution turned brown and the experiment was discontinued.

This example shows that metallic copper can be effective in reducing cupric ion at pH's as high as 4.2.

What is claimed is:

1. A method of fabricating a solar cell comprising:
   (a) dipping an electrically conductive substrate having a layer of cadmium sulfide deposited thereon into a cuprous ion solution in contact with metallic copper for a sufficient time to form a layer of $Cu_xS$ thereon; and
   (b) fabricating an electrical contact to the resulting $Cu_xS$ layer.

2. A method according to claim 1 wherein the pH is less than pH 4.5.

3. The method according to claim 2 wherein the pH is from about 1.5 to about 2.5.

4. The method according to claim 3 wherein the solution contains negative ions which stabilize the $Cu^+$ by complexing with it.

5. The method according to claim 4 wherein the negative ions are $Cl^-$, $Br^-$, or mixtures thereof.

6. The method according to claim 5 wherein the solutions contain at least two $Cl^-$ ions for every $Cu^+$ ion.

7. The method according to claim 5 wherein sufficient copper metal is added to reduce the potential of the solution versus a silver/silver chloride electrode to less than about 0.05 volts.

8. The method according to claim 5 wherein the copper metal has a high surface area.

9. The method according to claims 1, 6, 2, or 4 wherein the layer of Cadmium Sulfide incorporates zinc and has the formula $Zn_yCd_{(1-y)}S$.

* * * * *